(12) United States Patent
Takehara (10) Patent No.: US 6,967,520 B2
(45) Date of Patent: Nov. 22, 2005

(54) GATE DRIVE CIRCUIT, WHICH MAKES THE GATE-CHARGE FLOW BACK TO THE LOAD AND THE MAIN POWER SOURCE

(75) Inventor: Nobuyoshi Takehara, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/683,588

(22) Filed: Oct. 14, 2003

(65) Prior Publication Data

US 2004/0075486 A1    Apr. 22, 2004

(30) Foreign Application Priority Data

Oct. 21, 2002    (JP) .............................. 2002-305833

(51) Int. Cl.[7] ......................................... H03K 17/687
(52) U.S. Cl. .................................... 327/427; 327/440
(58) Field of Search ................ 327/108–110, 374–377, 327/387–391, 419, 427, 440; 363/13, 21.03, 363/20, 97; 323/265, 282

(56) References Cited

U.S. PATENT DOCUMENTS

| | | | |
|---|---|---|---|
| 3,641,424 A | * | 2/1972 | Kuykendall .................. 323/286 |
| 3,654,518 A | * | 4/1972 | Phelps et al. ................ 361/101 |
| 4,481,434 A | * | 11/1984 | Janutka ....................... 327/377 |
| 4,605,865 A | | 8/1986 | Yuzurihara ................... 327/434 |
| 4,709,316 A | * | 11/1987 | Ngo et al. ................. 363/21.03 |
| 4,894,568 A | | 1/1990 | Pavlin ......................... 327/434 |
| 5,140,201 A | * | 8/1992 | Uenishi ....................... 327/108 |
| 5,264,736 A | * | 11/1993 | Jacobson ..................... 327/365 |
| 5,298,797 A | | 3/1994 | Redl ........................... 327/387 |
| 5,315,533 A | | 5/1994 | Stich et al. .................. 700/298 |
| 5,347,164 A | | 9/1994 | Yeh ............................. 307/66 |
| 5,424,937 A | | 6/1995 | Iyotani et al. ............... 363/136 |
| 5,455,757 A | * | 10/1995 | Nguyen et al. ........... 363/21.16 |
| 5,467,047 A | | 11/1995 | Robb .......................... 327/377 |
| 5,660,643 A | | 8/1997 | Toggweiler ................. 136/244 |
| 5,737,208 A | | 4/1998 | Chen .......................... 363/133 |

(Continued)

FOREIGN PATENT DOCUMENTS

JP    3-36332    5/1991

(Continued)

OTHER PUBLICATIONS

C. Ong, et al., "A Mathematical Model For Power Mosfet Capacitances," Proceedings of the Annual Power Electronics Specialists Conference, Conf. 22, Jun. 24, 1991, pp. 423-429.

Primary Examiner—Minh Nguyen
(74) Attorney, Agent, or Firm—Fitzpatrick, Cella, Harper & Scinto (57) ABSTRACT

A gate driving circuit having: a direct current power source; a driving signal source for outputting signal; a main switch device, having a gate terminal in which the signal outputted from the driving signal source is inputted, for controlling a conduction state between a source terminal and a drain terminal; a load energized when the conduction state between the source and drain terminals becomes a conductive state; a reverse current blocking unit, connected between the driving signal source and the gate terminal; and a regenerative unit, connected between the gate terminal and a high potential side of the power source, which becomes a conductive state when the conduction state between the source and drain terminals is a non-conductive state. A gate-source threshold voltage to obtain the conductive state between the source and drain terminals is set higher than an output voltage of the power source.

7 Claims, 9 Drawing Sheets

U.S. PATENT DOCUMENTS

| | | | |
|---|---|---|---|
| 6,093,885 A | 7/2000 | Takehara et al. | 136/244 |
| 6,556,396 B1 | 4/2003 | Takehara et al. | 361/42 |
| 6,731,023 B2 | 5/2004 | Rothleitner et al. | 307/64 |
| 2001/0040453 A1 | 11/2001 | Toyomura et al. | 324/332 |

FOREIGN PATENT DOCUMENTS

| | | |
|---|---|---|
| JP | 5-344708 | 12/1993 |
| JP | 2002-158021 | 5/2002 |

* cited by examiner

|  | ENERGY SENT WHEN MAIN DEVICE IS ON (nJ) | RECOVERED ENERGY WHEN MAIN DEVICE IS OFF (nJ) | ENERGY RECOVERY PERCENTAGE (%) | REDUCTION AMOUNT OF GATE DRIVING ENERGY TO CONVENTIONAL ART (%) |
|---|---|---|---|---|
| CONVENTIONAL ART | 275 | 0 | 0% | 0% |
| EMBODIMENT | 192.5 | 57.8 | 30% | 51% |

GATE DRIVE CIRCUIT, WHICH MAKES THE GATE-CHARGE FLOW BACK TO THE LOAD AND THE MAIN POWER SOURCE

FIELD OF THE INVENTION

The present invention relates to a gate driving circuit, and more particularly, to a gate driving circuit used in a power inverting device and the like.

BACKGROUND OF THE INVENTION

In recent years, the environmental problems such as earth warming due to release of carbon dioxide gas accompanying the use of fossil fuels, radioactive contamination caused by accidents in atomic power plants, and nuclear waste have become serious, and the spotlight centers on terrestrial environment and energy. In this situation, a solar cell utilizing sunlight as an inexhaustible and clean energy source, geothermal power generation utilizing a geothermal source, wind power generation utilizing wind power, and the like are in practical use in the world.

The direct current electric power generated using the above natural energy is converted to alternating current electric power by an electric power converting device called an inverter, and supplied to, e.g., a commercial electric power system.

In this electric power converting device, improvement in conversion efficiency is important and power loss in a gate driving circuit is not negligible. To reduce the power loss, use of snubber energy in gate driving is known (See, e.g., Japanese Published Unexamined Patent Application No. 5-344708). Further, regeneration of gate electric power of a converter of a transistor on the power source side of a gate driving circuit is known (See, e.g., Japanese Published Examined Patent Application No. 3-36332). These techniques are generally regarded as electric power regeneration techniques, and unless these techniques are utilized, the gate electric power becomes electric power loss.

On the other hand, as a method of effectively using electric power generated by a solar cell, a single cell converter system is proposed (See, e.g., U.S. Pat. No. 5,660,643). According to this method, power generated by solar cells, which are not serially connected, as a low voltage of about 1 V, is inputted into an electric power converting device, voltage-boosted there and utilized.

In this converter system, the gate driving power and the reduction of power loss are also important. However, any method for reducing electric power loss, appropriate to a gate driving circuit used in a low-voltage area to handle a comparatively small amount of electric power, has not been proposed so far.

SUMMARY OF THE INVENTION

The present invention has its object to provide a gate driving circuit with a reduced power loss used in a low-voltage small area to handle a small amount of electric power.

According to one aspect of the present invention, the foregoing object is attained by providing a gate driving circuit comprising: a direct current power source; a driving signal source for outputting a high-level or low-level signal; a main switch device, having a gate terminal in which the signal outputted from the driving signal source is inputted, for controlling a conduction state between a source terminal and a drain terminal in correspondence with a level of the signal; a load energized when the conduction state between the source terminal and the drain terminal becomes a conductive state; reverse current blocking means, connected between the driving signal source and the gate terminal, for outputting a signal only in a direction from the driving signal source to the gate terminal; and regenerative means, connected between the gate terminal and a high potential side of the direct current power source, which becomes the conductive state when the conduction state between the source terminal and the drain terminal is a non-conductive state, wherein a gate-source threshold voltage to obtain the conductive state between the source terminal and the drain terminal is higher than an output voltage of the direct current power source.

In this construction, a part of electric power used upon driving a main switch device can be regenerated (reused) on the power source side or load side, thus the electric power loss accompanying driving of the main switch device can be reduced. Further, when the main switch device is in a non-conductive state, as the voltage applied to the gate terminal is merely dropped to the voltage of direct current power source, the potential difference between the conductive state of the gate and the non-conductive state of the gate becomes small, and driving electric power necessary for obtaining the conductive state can be reduced.

Accordingly, the electric power loss can be reduced in a gate driving circuit used in a low-voltage area to handle a small amount of electric power.

In the gate driving circuit, the main switch device may include an N-channel MOSFET or an N-channel IGBT.

Further, in the gate driving circuit, the reverse current blocking means may include a diode.

Further, in the gate driving circuit, the regenerative means may include a MOSFET.

Further, another object of the present invention is to provide a power source circuit using the above gate driving circuit.

According to another aspect of the present invention, the foregoing object is attained by providing a power source circuit comprising: a gate driving circuit having: a direct current power source; a driving signal source for outputting a high-level or low-level signal; a main switch device, having a gate terminal in which the signal outputted from the driving signal source is inputted, for controlling a conduction state between a source terminal and a drain terminal in correspondence with a level of the signal; a load energized when the conduction state between the source terminal and the drain terminal becomes a conductive state; reverse current blocking means, connected between the driving signal source and the gate terminal, for outputting a signal only in a direction from the driving signal source to the gate terminal; and regenerative means, connected between the gate terminal and a high potential side of the direct current power source, which becomes the conductive state when the conduction state between the source terminal and the drain terminal is a non-conductive state, wherein in the gate driving circuit, a gate-source threshold voltage to obtain the conductive state between the source terminal and the drain terminal is higher than an output voltage of the direct current power source, and wherein when the conduction state between the source terminal and the drain terminal becomes the conductive state, the output voltage from the direct current power source is supplied to the load.

Further, in the power source circuit, the load may include a primary-side coil of a transformer.

Further, the power source circuit may perform DC/AC conversion.

Further, in the power source circuit, the direct current power source includes plural solar cells which are not serially connected.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

<First Embodiment>

Figure 1:
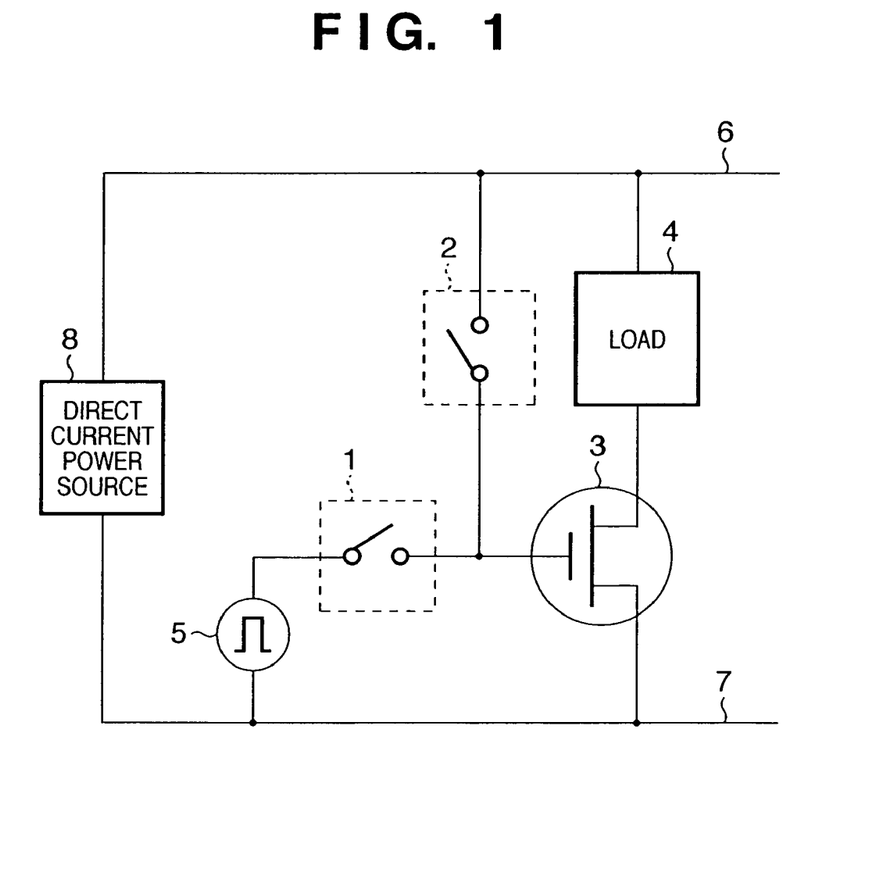
FIG. 1 is a block diagram showing the construction of a gate driving circuit according to a first embodiment of the present invention.

FIG. 1 is a block diagram showing the construction of a gate driving circuit according to a first embodiment of the present invention. As shown in FIG. 1, the gate driving circuit includes reverse current blocking means 1, regenerative means 2, a main switch device 3, a load 4, a gate driving signal source 5 and a direct current power source 8. Note that reference numeral 6 denotes a high-potential side terminal of the power source, and 7, a low-potential side terminal of the power source. Hereinbelow, the respective constituent elements and their operations will be described.

[Main Switch Device 3]

The main switch device 3 is a MOS gate switch device of P-channel or N-channel conductive type. In the present invention, the relation between the absolute value of a threshold voltage to turn the gate ON and the absolute value of the power source voltage is substantially important, and the former must be greater than the latter. Only if this condition is satisfied, the advantage of the present invention, "improvement in efficiency by gate charge regeneration" can be obtained.

Note that in the present specification, "the high-potential side of the power source" corresponds to, depending on the conductive type of the switch device, the positive pole side of the power source in the case of N-channel MOSFET or N-channel IGBT, or corresponds to the negative pole side of the power source in the case of P-channel MOSFET or P-channel IGBT. That is, the high-potential side does not merely indicate the level of voltage. Further, "the low-potential side of the power source" corresponds to the opposite side to the "high-potential side of the power source".

[Reverse Current Blocking Means 1]

In brief, the reverse current blocking means 1 is a switch means which operates in synchronization with the main switch device 3. Preferably the reverse current blocking means is a diode. Other than the diode, a mechanical contact such as a relay, a small-capacity MOSFET, a 3-state gate (logic gate capable of outputting High, Low and High impedance (no connection) states) used in a digital circuit may be employed. Further, a photo MOS relay as a combination of a photo diode and a MOSFET, and the like, may be employed.

In the present embodiment, the reverse current blocking means is provided with control means which, when the main switch device 3 is ON, turns the switch means ON (conductive state), and, on the other hand, when the main switch device 3 is OFF, turns the switch means OFF (non-conductive state).

[Regenerative Means 2]

The regenerative means 2 is a switch means which operates complementarily to the main switch device 3. Basically the regenerative means 2 is a switch means similar to the reverse current blocking means 1. However, a diode is not appropriate as the regenerative means 2 since in use of a diode, when the main switch device 3 is turned ON by application of high potential to the gate, the electric current flows to the power source side and power loss is continuously caused while the main switch device 3 is ON.

Accordingly, as the regenerative means 2 of the present embodiment, a small-capacity MOSFET or the like is preferably employed as a switch device where the conduction state can be controlled by a control terminal. The regenerative means 2 is provided with control means which, when the main switch device 3 is ON, turns the switch means ON, and, on the other hand, when the main switch device 3 is OFF, turns the switch means OFF.

As the switch means used as the regenerative means 2, a small-capacity MOSFET of the same conductive type as that of the main switch device 3 is particularly preferable. By utilizing the relation of the potential that the absolute threshold voltage to turn the gate ON is greater than the absolute voltage of the power source, this switch means can be driven by the power source to drive the main switch device 3. At this time, power loss is caused by gate charge in the small-capacity MOSFET as in the case of the main switch device. However, as the switch means used as the regenerative means has a small capacity merely to drive the main switch device, the power loss by the gate charge is extremely small in comparison with the power loss in the main switch device. In the case of a small-capacity N-channel MOSFET, having a high performance capability, the gate charge is particularly small.

[Load 4]

Since there is no particular limitation on the load 4, a necessary load such as a resistive load, an inductive load and a primary coil of a transformer can be appropriately used.

[Direct Current Power Source 8]

Also, there is no particular limitation on the type of direct current power source 8. However, the output voltage must be lower than the threshold value of the gate voltage to turn the main switch device 3. For example, if the gate voltage to turn the main switch device 3 ON is 2V, the voltage of the power source must be lower, e.g., 1 V.

Generally, as a conduction resistance value of a MOSFET changes exponentially with respect to the gate voltage, the threshold voltage to attain a resistance value in an ON state necessary for an application must be appropriately obtained by actual measurement or the like. It is possible to refer to a value described in a data sheet of a device to be used. However, in this case, attention must be paid to a resistance value of the switch device at that time (often defined as a measurement condition on the data sheet).

Further, in the present embodiment, the voltage applied to the gate when the main switch device 3 is OFF is equal to the voltage of the direct current power source, but is not 0. Accordingly, the voltage of the direct current power source must be sufficiently lower than the above-obtained threshold voltage; if the voltage of the direct current power source is set otherwise, the main switch device 3 is not turned OFF upon regeneration and power supply to the load cannot be controlled.

Further, the direct current power source used in the present embodiment must be provided with a function of receiving energy flowing from the gate, and for this purpose, it is desirable that the power source is provided with a power storage means as typified by an electrolytic capacitor. However, in some cases, a parasitic capacitance existing in the power source is sufficiently used as the power storage means, and the capacitor is not necessarily provided.

As long as the above conditions are satisfied, a direct current power source can be selected from various devices such as a solar cell, a fuel battery, an alkaline dry cell, and a nickel hydride battery.

[Gate Driving Signal Source 5]

The gate driving signal source 5 of the present embodiment is not merely a signal source but must be a signal source with a small-capacity power source function to supply electric power to drive a gate electrostatic capacitance. The output voltage, which must be sufficient to turn the main switch device 3 ON, is about 2.5 to 15 V. Recently, the output voltage is particularly 3.3 or 5 V in correspondence with reduction of logic IC voltage. As an oscillation circuit used as a signal source and a power source circuit, well-known circuits can be employed, and the detailed explanation of the constructions thereof, almost not related to the subject matter of the present invention, will be omitted.

(Particular Construction)

Hereinbelow, the operation of the above embodiment will be described in detail. Note that in the following operation, as the direct current power source 8, a commercial AA alkali-manganese dry cell (output voltage: 1.5 V) and a multilayer ceramic capacitor (100 µF) are serially connected, as the load 4, a 100 Ω resistor is used, and the reverse current blocking means 1 and the regenerative means 2, commercial photo MOS relays are used.

Further, as the main switch device 3, an N-channel power MOSFET (model number: ISL9N302AP; a product of Fairchild Semiconductor) is used. As an N-channel MOSFET is the most general power device, which more easily attains high performance in comparison with a P-channel device, it is preferably used. Note that in the data sheet of the MOS used in the present embodiment, the threshold voltage is 1.0 to 3.0 V. However, as the actually-measured conduction resistance is 10 MW or greater (i.e., OFF state) when the gate voltage is equal to the power supply voltage, 1.5 V, there is no problem regarding the operation of the present embodiment. The threshold voltage to substantially obtain the ON state is far greater than the power source voltage. In this manner, upon implementation of the present invention, it is substantially significant that the main switch device is turned OFF in a status where the power source voltage is applied to the gate of the main switch device.

As the driving signal source 5, a rectangular wave oscillator having an output of 5 V (oscillation frequency: 100 Hz) is used. The output is connected to the reverse current blocking means 1 and the gate of the main switch device 3, and a negative output of the oscillator is connected to the regenerative means 2. In this arrangement, when the output from the oscillator is 5 V (high level), the main switch device 3 and the reverse current blocking means 1 are turned ON, and the regenerative means 2 is turned OFF. On the other hand, when the output from the oscillator is 0 V (low level), the reverse current blocking means 1 and the main switch device 3 are turned OFF, and the regenerative means 2 is turned ON. To attain the advantages of the present invention, it is necessary to realize the above operations of the switches even with other circuit parts.

Figure 9:
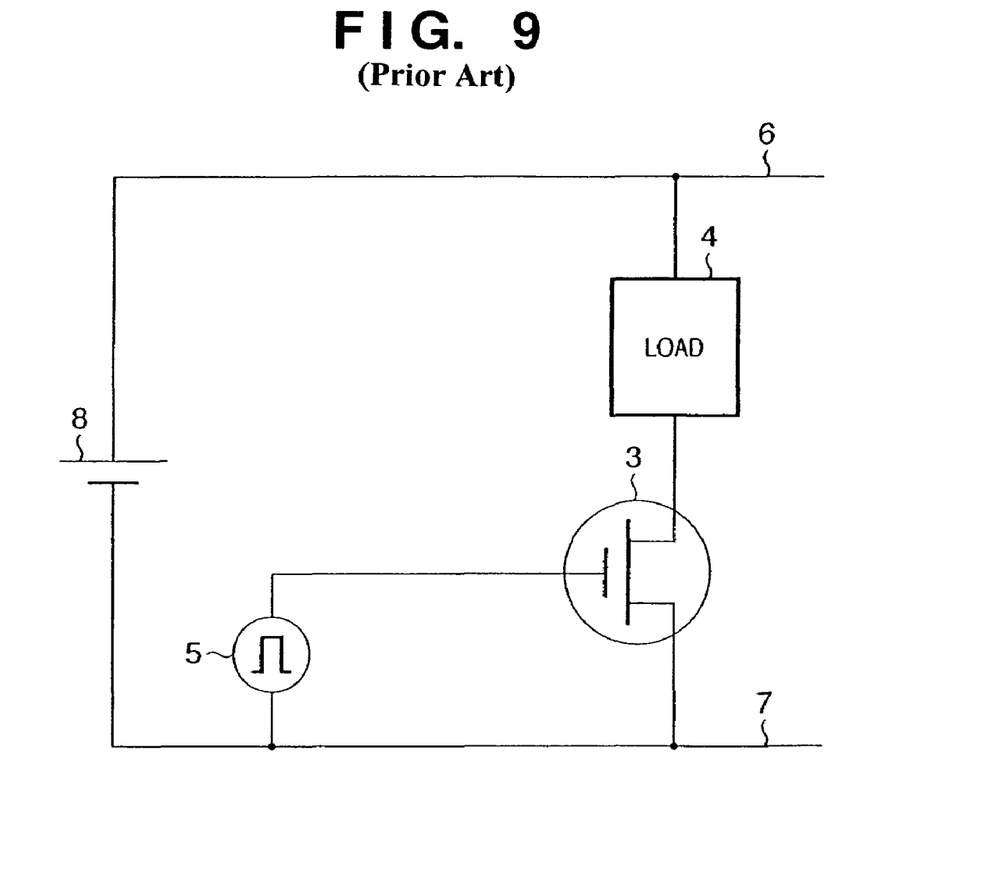
FIG. 9 is a block diagram showing the construction of a conventional push-pull power inverter as a comparative example.

Further, as a comparative example, a conventional gate driving circuit as shown in FIG. 9 is used. In this circuit, the reverse current blocking means and the regenerative means are omitted from the construction of the present embodiment.

(Operation)

(1) ON Operation

When the output from the oscillator as the driving signal source 5 is 5 V, the gate of the main switch device 3 is charged to 5V via the reverse current blocking means 1. The electrostatic capacitance of the gate of the main switch device 3 is 11000 pF, and energy of ½ CV²(J) is stored at the gate. Note that in the comparative example, the operation in an ON state is the same.

(2) OFF Operation

Figure 2:
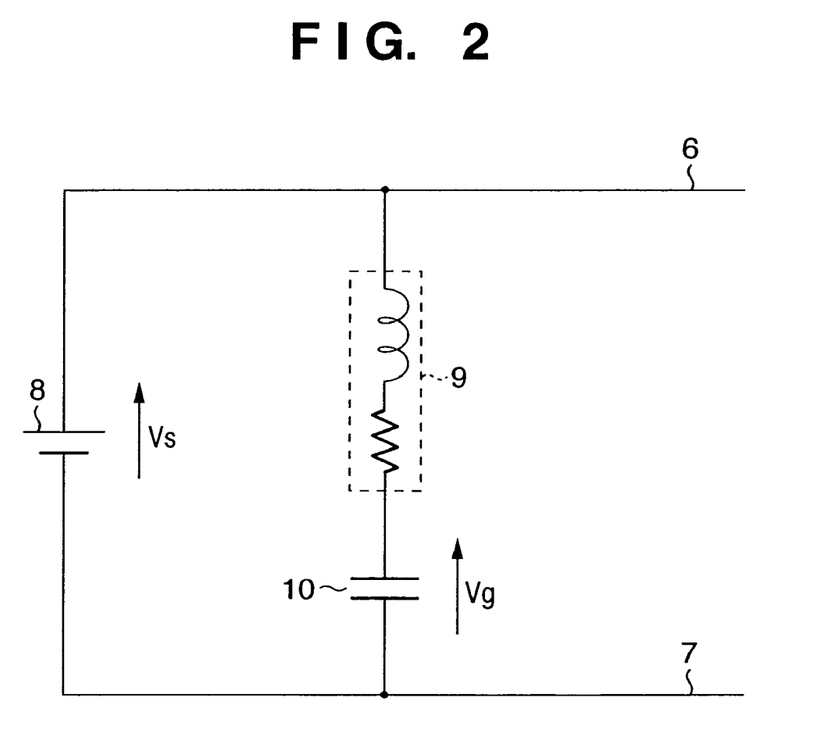
FIG. 2 is a block diagram showing an equivalent circuit upon regeneration of gate charge in the circuit in FIG. 1.

When the output from the oscillator as the driving signal source 5 is 0 V, the reverse current blocking means 1 is turned OFF, and the regenerative means 2 is turned ON. FIG. 2 is an equivalent circuit diagram in this status. A capacitor 10 indicates the electrostatic capacitance of the main switch device 3, and numeral 9, parasitic impedance. The capacitor 10 is connected through the parasitic impedance 9 to the direct current power source 8.

As the gate driving voltage is 5 V and the voltage of the direct current power source 8 is 1.5 V, a part of the charge stored in the capacitor 10 flows into the direct current power source 8 and the energy is regenerated. The amount of regeneration is determined by the ratio between the voltage of the direct current power source 8 and the gate driving voltage. In this case, as the voltage of the direct current power source is 1.5 V and the gate driving voltage is 5 V, about 30% (=$1.5/5$) of the energy sent from the driving signal source 5 to the gate is regenerated on the power source side.

As a result of this operation, the gate voltage is dropped to 1.5 V as the voltage of the direct current power source 8 but is not further dropped.

On the other hand, in the conventional circuit as shown in FIG. 9, the gate voltage is dropped to 0 V, and the energy stored by the gate electrostatic capacitance is released to the low potential side and lost.

(3) Re-ON Operation

In the conventional circuit, to turn the main switch device 3 ON, charging from 0 V to 5 V is necessary, however, in the circuit of the present embodiment, the charging is only from 1.5 V to 5 V, thus the energy necessary to turn the main switch device 3 ON again can be reduced.

Figure 3:
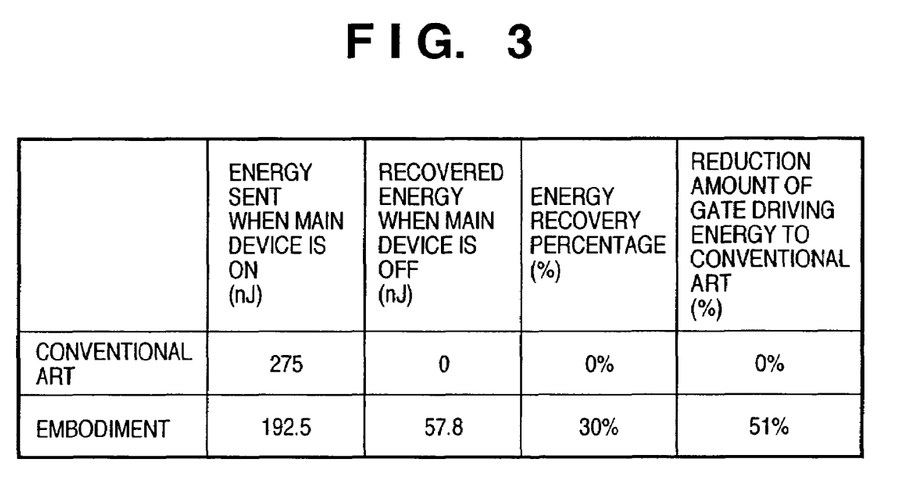
FIG. 3 is a table showing a comparison of energy between the circuit in FIG. 1 and a conventional gate driving circuit.

FIG. 3 shows the calculation results of energy recovery amount and the like in the operations of the above embodiment and the conventional art. As shown in FIG. 3, according to the present embodiment, about 30% of the sent energy can be recovered, and more energy sent in the ON state can be saved in comparison with the conventional art. The total amount of the gate driving energy (=transmitted energy−recovered energy) can be reduced about 51%. In this manner, as the gate driving energy can be reduced, the capacity of the gate driving power source can be small.

<Second Embodiment>

Hereinbelow, a second embodiment of the present invention will be described. Note that in the following description, similar elements to those of the above first embodiment have the same reference numerals and the explanations thereof will be omitted.

Figure 4:
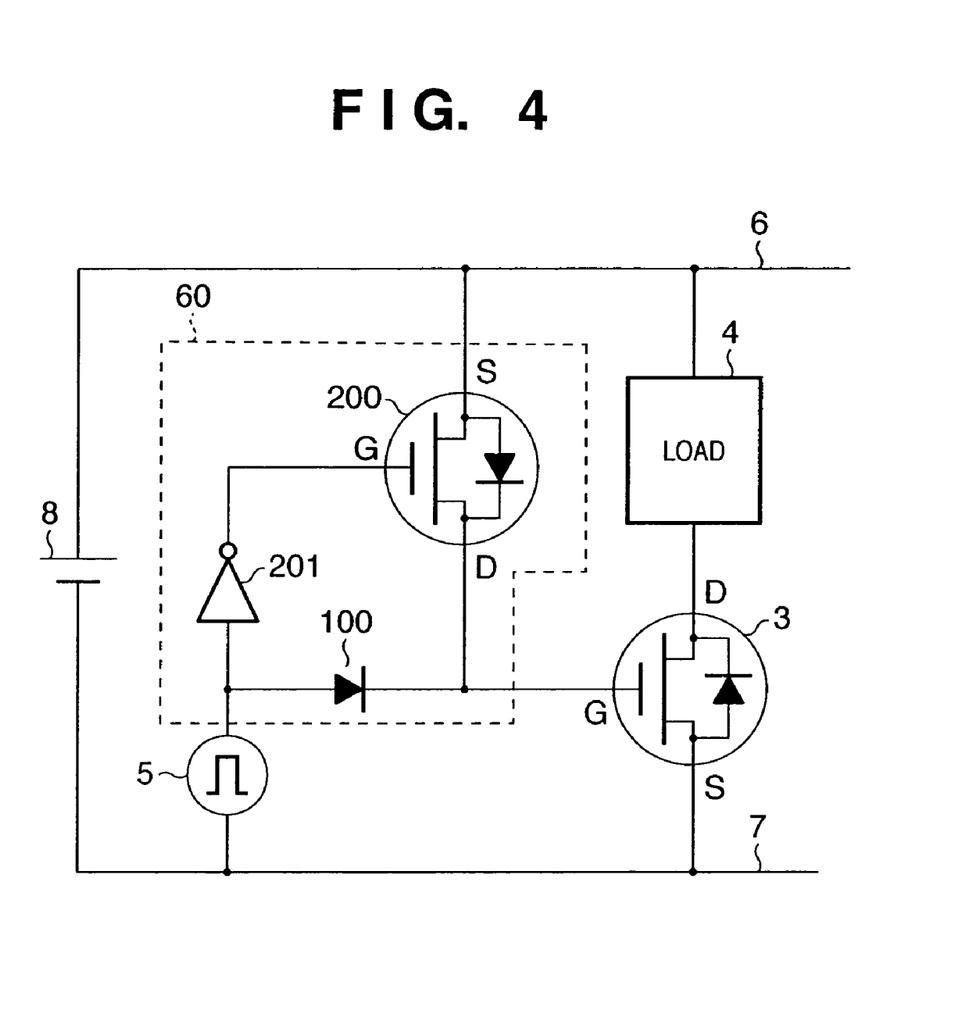
FIG. 4 is a block diagram showing the construction of the gate driving circuit according to a second embodiment of the present invention.

FIG. 4 is a block diagram showing the construction of the gate driving circuit according to the second embodiment of the present invention. As a particular construction of the present embodiment, a commercial nickel hydride battery (1.2 V) and an aluminum electrolytic capacitor (470 μF) are serially connected as the direct current power source 8. The main switch device 3, the driving signal source 5 and the load 4 are the same as those of the first embodiment.

As the reverse current blocking means, a Schottky barrier diode 100 is used, and as the regenerative image, a small-capacity N-channel MOSFET 200 (model number: IRLMS1902; a product of International Rectifier) is used. As a diode is used as the reverse current blocking means, automatic reverse current blocking can be realized, and wiring from the driving signal source 5 can be omitted.

Further, an inverse logic signal of that applied to the main switch device 3 is sent to the gate of the small-capacity MOSFET 200 via an NOT device 201, such that the small-capacity MOSFET 200 is turned OFF when the main switch device 3 is turned ON while the small-capacity MOSFET 200 is turned ON when the main switch device 3 is turned OFF.

As shown in FIG. 4, the source terminal of the small-capacity MOSFET 200 is connected to the high potential side of the direct current power source 8, and the drain terminal is connected to the gate terminal of the main switch device 3. This is the inverse of normal connection (generally in an N-channel MOSFET, the drain terminal is connected to the positive potential side of the power source). However, by this connection, discharging (leakage) of stored charge in the gate of the main switch device 3 through the internal diode of the MOSFET can be prevented.

Further, from the relation of the potentials, when the main switch device 3 is OFF, the source-gate voltage of the small-capacity MOSFET 200 is 3.8 V (=5 V−1.2 V); accordingly, a device which becomes ON at this voltage must be selected. The small-capacity MOSFET 200 used in the present embodiment satisfies this requirement. The charge stored at the gate of the main switch device 3 is regenerated via the small-capacity MOSFET 200 to the direct current power source 8.

Figure 5:
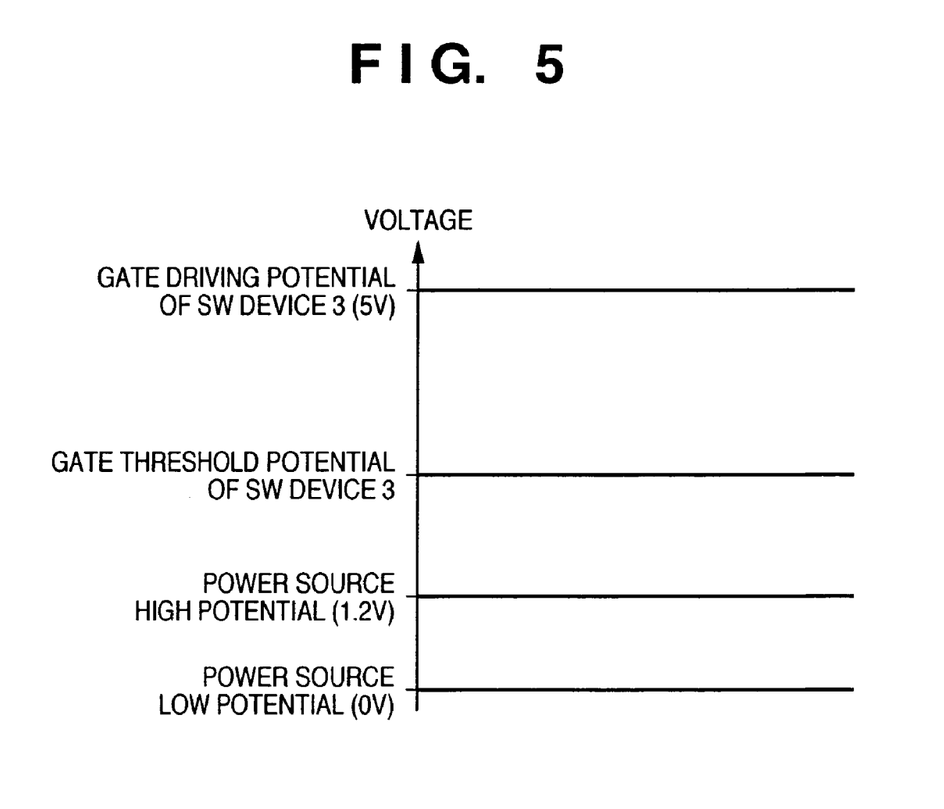
FIG. 5 illustrates potentials of respective parts necessary for the operation of the gate driving circuit in FIG. 4.

FIG. 5 illustrates the relation among the potentials in the present embodiment. To perform the operation of the present embodiment, the relation among the threshold potential of the gate to turn the main switch device 3, the potential of the direct current power source 8, and the driving potential applied to the gate to turn the main switch device 3 ON must be as shown in FIG. 5.

The feature of the present embodiment is that the construction is more compact than that of the first embodiment. A regenerative block 60 having the small-capacity MOSFET 200, the NOT device 201 and the reverse current blocking diode 100 can be easily formed as a single semiconductor chip. As the operation of the present embodiment is the same as that of the first embodiment, the explanation thereof will be omitted.

<Third Embodiment>

Hereinbelow, a third embodiment of the present invention will be described. Note that in the following description, similar elements to those of the above first and second embodiments have the same reference numerals and the explanations thereof will be omitted.

Figure 6:
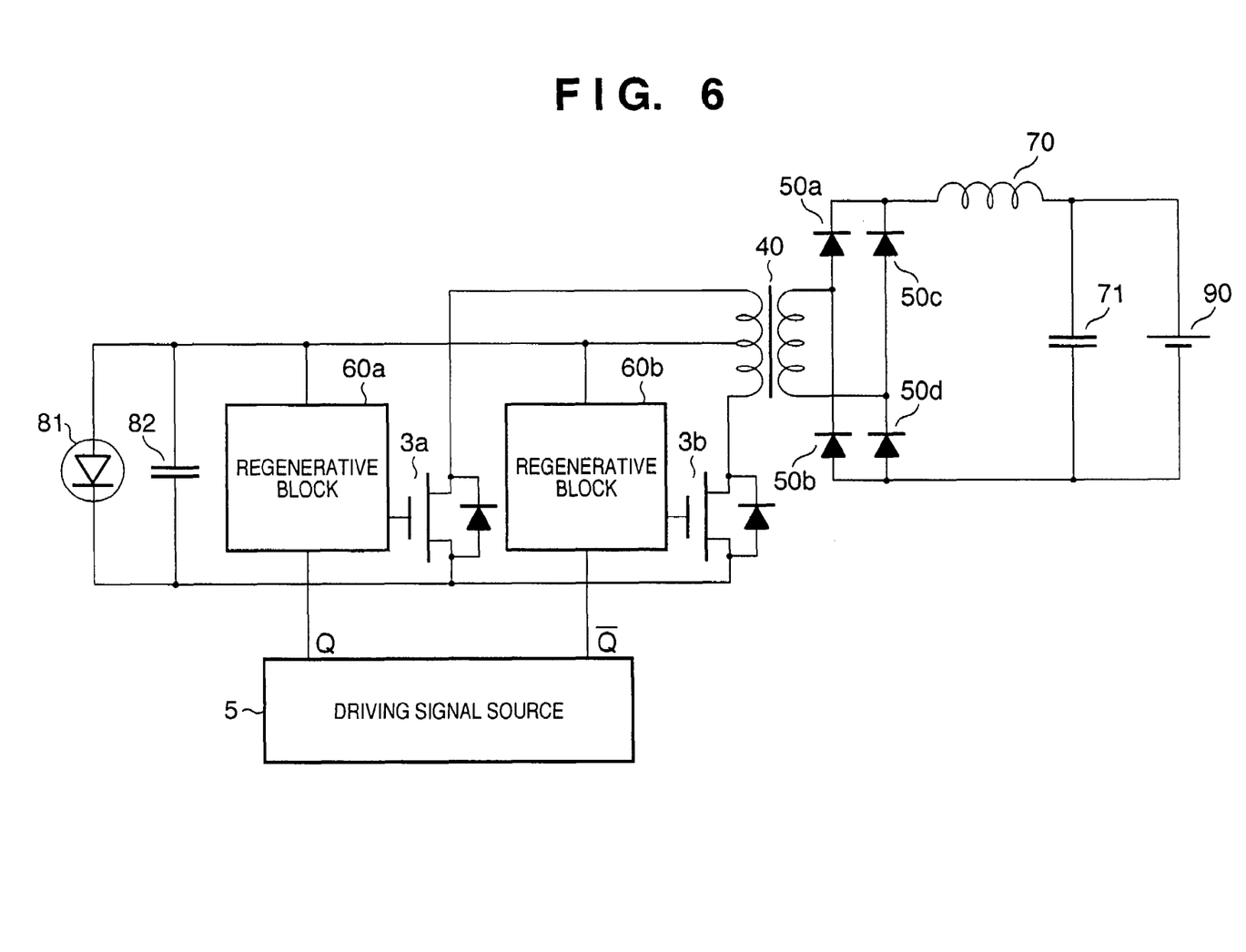
FIG. 6 is a block diagram showing the construction of a push-pull power inverter according to a third embodiment of the present invention.

The present embodiment is an example where the gate driving circuit according to the present invention is applied to a push-pull power inverter. FIG. 6 is a block diagram showing the construction of a solar power generation system having a push-pull power inverter to which the gate driving circuit of the present invention is applied.

The solar power generation system has a solar cell 81 and a capacitor 82 which are parallel-connected as the direct current power source, and respectively two main switch devices 3a, 3b and regenerative blocks 60a, 60b similar to those in the gate driving circuit of the second embodiment. Further, the system has a transformer 40, diode bridges 50a to 50d, and a smoothing filer having a coil 70 and a capacitor 71, for power inversion. The inverted electric power is stored in a secondary battery 90.

In the construction in FIG. 6, a well-known tandem solar battery, as a so-called "single cell" type solar battery module (output under a standard measurement condition (AM 1.5, 1.0 kW/m$^2$) is 1.0 V 10 A) which is not electrically serially connected outside, is used as the solar cell 81, and a multilayer ceramic capacitor (100 μF) is used as the capacitor 82. A transformer having a 1:15 coil turn ratio is used as the transformer 40. The primary side coil of the transformer 40 is used as the load of the main switch device 3. Further, the output from the secondary side coil of the transformer 40 is rectified by the diode bridges 50a to 50d, smoothed through the smoothing filter having the coil 70 and the capacitor 71, and sent to the commercial secondary battery 90 (voltage: 12V, capacity: 200 Ah). A 50% duty rectangular-wave oscillator is used as the driving signal source 5, to ON/OFF drive the main switch devices 3a and 3b alternately.

Figure 7:
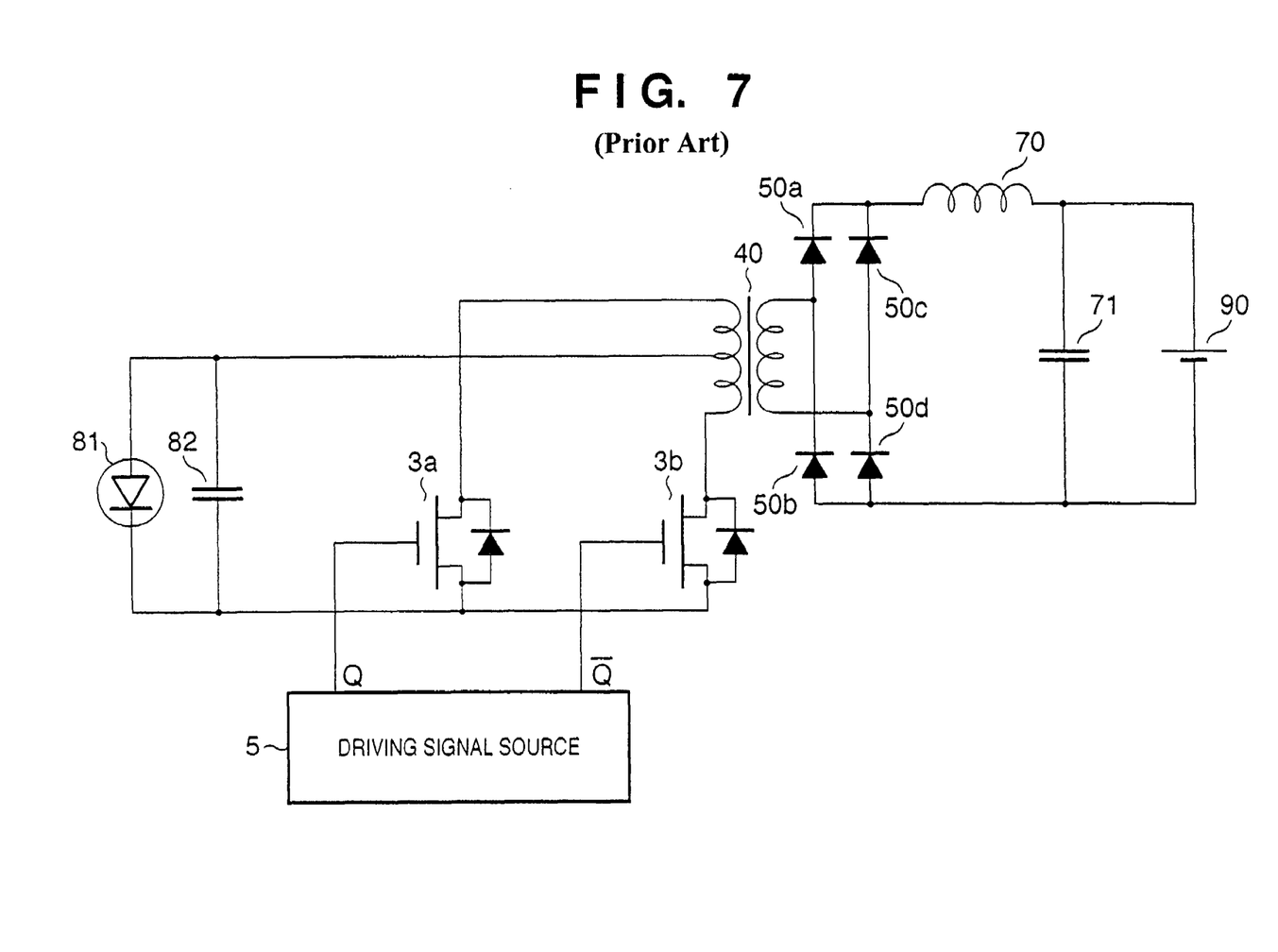
FIG. 7 is a block diagram showing the construction of a conventional push-pull power inverter as a comparative example.

FIG. 7 is a block diagram showing the construction of a circuit adopting conventional gate driving as a comparative example. It is easily understood that this circuit is different from the circuit as shown in FIG. 6 in that the regenerative blocks 60a and 60b are not used.

The operation of the regenerative blocks 60a and 60b is the same as that described in the second embodiment. As the regenerative blocks operate to directly regenerate the charge stored at the gates of the main switch devices 3a and 3b on the power source side and the load side, the gate driving power can be reduced.

As described above, the present invention is advantageous in a power inverter such as a push-pull circuit. Especially in a circuit driven on 50% duty such as a push-pull circuit of the present embodiment, as driving signals to the main switch devices 3a and 3b are complementary to each other, the NOT device included in the regenerative block can be omitted by directly utilizing this relation. Thus, the construction of the regenerative block can be further simplified.

<Fourth Embodiment>

Hereinbelow, a fourth embodiment of the present invention will be described. Note that in the following description, similar elements to those of the above first to third embodiments have the same reference numerals and the explanations thereof will be omitted.

Figure 8:
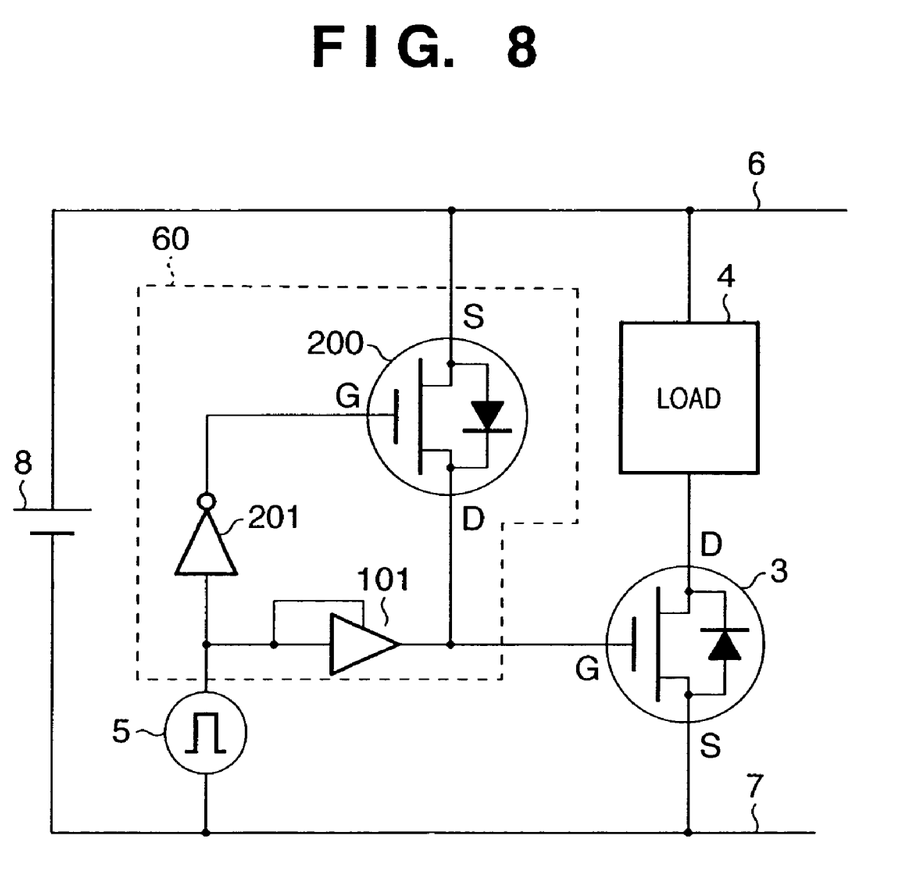
FIG. 8 is a block diagram showing the construction of the push-pull power inverter according to a fourth embodiment.

FIG. 8 is a block diagram showing the construction of the fourth embodiment. In the present embodiment, as the reverse current blocking means provided in the regenerative block 60, a 3-state buffer device 101 (model number: 74HC126) is used, and the signal from the driving signal source is directly inputted into the conduction control terminal as shown in FIG. 8.

In this arrangement, if the output from the driving signal source 5 is at the high level, the output is applied to the gate terminal of the main switch device 3, while if the output from the driving signal source 5 is at the low level, the gate terminal of the main switch device 3 and the driving signal source 5 are in a non-connected state (high impedance connection state) and the above reverse current blocking means operates. The power loss is reduced in comparison with the case using a Schottky diode as the reverse current blocking means, and this arrangement is advantageous in integration.

Note that the gate driving circuit of the present invention can be applied to an apparatus comprising a single device (e.g., a power supply apparatus) or to a system constituted by a plurality of devices (e.g., a power supply system).

As many apparently widely different embodiments of the present invention can be made without departing from the spirit and scope thereof, it is to be understood that the invention is not limited to the specific embodiments thereof except as defined in the appended claims.

What is claimed is:

1. A gate driving circuit comprising:
a direct current power source;
a driving signal source for outputting a high-level or low-level signal;
a main switch device, having a gate terminal in which the signal outputted from the driving signal source is inputted, for controlling a conduction state between a source terminal and a drain terminal in correspondence with a level of the signal;
a load energized when the conduction state between the source terminal and the drain terminal becomes conductive;
reverse current blocking means, connected between the driving signal source and the gate terminal, for outputting a signal only in a direction from the driving signal source to the gate terminal; and
regenerative means for regenerating a part of power outputted by the driving signal source in the direct current power source, the regenerative means being connected between the gate terminal and a high potential side of the direct current power source, the regenerative means becoming conductive when the conduction state between the source terminal and the drain terminal is non-conductive,
wherein a gate-source threshold voltage to make the conduction state between the source terminal and the drain terminal conductive is higher than an output voltage of the direct current power source, and
wherein the regenerative means includes a MOSFET.

2. The gate driving circuit according to claim 1, wherein the main switch device includes an N-channel MOSFET or an N-channel IGBT.

3. The gate driving circuit according to claim 1, wherein the reverse current blocking means includes a diode.

4. A power source circuit comprising:
a gate driving circuit having: a direct current power source; a driving signal source for outputting a high-level or low-level signal; a main switch device, having a gate terminal in which the signal outputted from the driving signal source is inputted, for controlling a conduction state between a source terminal and a drain terminal in correspondence with a level of the signal; a load energized when the conduction state between the source terminal and the drain terminal becomes conductive; reverse current blocking means, connected between the driving signal source and the gate terminal, for outputting a signal only in a direction from the driving signal source to the gate terminal; and regenerative means for regenerating a part of power outputted by the driving signal source in the direct current power source, the regenerative means being connected between the gate terminal and a high potential side of the direct current power source, and the regenerative means becoming conductive when the conduction state between the source terminal and the drain terminal is non-conductive,
wherein in the gate driving circuit, a gate-source threshold voltage to make the conduction state between the source terminal and the drain terminal conductive is higher than an output voltage of the direct current power source,
and wherein when the conduction state between the source terminal and the drain terminal becomes conductive, the output voltage from the direct current power source is supplied to the load, and
wherein the regenerative means includes a MOSFET.

5. The power source circuit according to claim 4, wherein the load includes a primary-side coil of a transformer.

6. The power source circuit according to claim 4, wherein the power source circuit performs DC/AC conversion.

7. The power source circuit according to claim 4, wherein the direct current power source includes plural solar cells which are not serially connected.

* * * * *

UNITED STATES PATENT AND TRADEMARK OFFICE
CERTIFICATE OF CORRECTION

PATENT NO. : 6,967,520 B2
DATED : November 22, 2005
INVENTOR(S) : Nobuyoshi Takehara

It is certified that error appears in the above-identified patent and that said Letters Patent is hereby corrected as shown below:

<u>Title page,</u>
Item [57], ABSTRACT,
Line 2, "signal;" should read -- a signal; --.

<u>Column 10,</u>
Line 47, "and wherein" should read -- wherein --.

Signed and Sealed this

Eighteenth Day of April, 2006

JON W. DUDAS
*Director of the United States Patent and Trademark Office*